United States Patent [19]
Tonks

[11] Patent Number: 6,025,791
[45] Date of Patent: Feb. 15, 2000

[54] PROCESS FOR THE TRANSMISSION OF A BINARY DATA FLOW HAVING SIGNALING LINES THAT CHANGE THEIR STATUS BASED ON GREY CODING

[75] Inventor: David John Tonks, Sigriswil, Switzerland

[73] Assignee: Ascom Tech AG, Bern, Switzerland

[21] Appl. No.: 08/938,617

[22] Filed: Sep. 26, 1997

[30]   Foreign Application Priority Data

Oct. 3, 1996 [CH]   Switzerland ............................. 2406/96

[51] Int. Cl.[7] ...................................................... H03M 7/16
[52] U.S. Cl. ............................................................... 341/96
[58] Field of Search ................................. 341/96, 97, 98

[56]   References Cited

U.S. PATENT DOCUMENTS

| | | | |
|---|---|---|---|
| 3,373,421 | 3/1968 | Wang | 341/97 |
| 3,675,236 | 7/1972 | Shoap | 341/97 |
| 4,528,665 | 7/1985 | Burns et al. | 371/51 |
| 5,300,930 | 4/1994 | Burger et al. | 341/96 |
| 5,633,636 | 5/1997 | Reyhani | 341/97 |

*Primary Examiner*—Howard L. Williams

[57]   ABSTRACT

Four parallel lines are provided for the guided transmission of a data flow with a high rate (sub-GHz range). Two data bits per transmission clock are transmitted via these lines. The other two remaining lines are used for signaling certain changes in both data bits. Data transmission and signaling are accomplished on the basis of the Grey code. In other words, only one of the four lines changes state per clock. The interface according to the invention has reduced sensitivity to signal skew and permits simple clock recovery in terms of circuit engineering.

19 Claims, 4 Drawing Sheets

PROCESS FOR THE TRANSMISSION OF A BINARY DATA FLOW HAVING SIGNALING LINES THAT CHANGE THEIR STATUS BASED ON GREY CODING

TECHNICAL FIELD

This invention relates to a process for the transmission of a binary data flow as well as a circuit arrangement for the implementation of the process.

STATE OF THE ART

Guided transmission of data at a high rate is assuming increasing significance. In this context, the focus of interest is on data rates in the sub-GHz range ( for example, 800 MHz) or up to several GHz and distances of typically less than one kilometer.

The CMOS I/O ports are currently unable to transmit 800 Mbit/s in a purely serial data format.

DESCRIPTION OF INVENTION

The object of the invention is to provide a process of the kind mentioned, which can get along with a limited bandwidth and that has the lowest possible sensitivity to signal skew. Furthermore, the process is to be suitable for implementation in a chip with the fewest possible contact connections (pins).

This problem is solved by the features of claim 1. Four parallel signals are provided according to the invention. They are used to transmit two data bits per clock. Two signals are used for the purpose of signaling certain changes in both data bits. Data transmission and signaling take place on the basis of the Grey code. In other words, only one of the four signals changes state per clock.

One needs a lesser bandwidth than in the case of a purely serial format. because two data bits are combined at a time and are transmitted at the same time. The signal format according to the invention makes it possible to get along without any phase-locked loop circuit in the receiver. One can therefore get along without test pins, and this is an advantage in terms of circuit engineering. In contrast to conventional "clock+data" interfaces, a precise monitoring of signal skew is not necessary either, because the frequency in each line at most is half as great as the clock frequency and because only one signal can change its state on account of the Grey coding per clock.

One can implement relatively simple and cheap system connections with the help of the interface according to the invention.

On the receiver side, the clock signal is derived from the state changes of the four lines or the four signals. For this purpose, the four lines or signals are, for example, XOR-connected, whereafter the clock signal can be generated by means of a frequency doubling. But one can also provide a circuit logic that will respond both to rising and falling edges.

To implement the process, a Dibit generator and an SDDI generator are provided on the transmitter side; they combine the binary data flow into bit pairs or they load the four lines, for example, with the signals according to the invention.

XOR elements are provided on the receiver side in order to tie the four signals together. For purposes of frequency doubling, the signal thus generated can be delayed in a delay element by half of its clock and can be XOR-tied-in with the undelayed component.

The following detailed description and all of the patent claims will bring out additional advantageous embodiments and feature combinations of the invention.

BRIEF DESCRIPTION OF DRAWINGS

The drawings used to explain the exemplary embodiment show the following.

Identical parts are basically provided with the same reference symbols in the figures.

WAYS TO IMPLEMENT THE INVENTION

Figure 1:
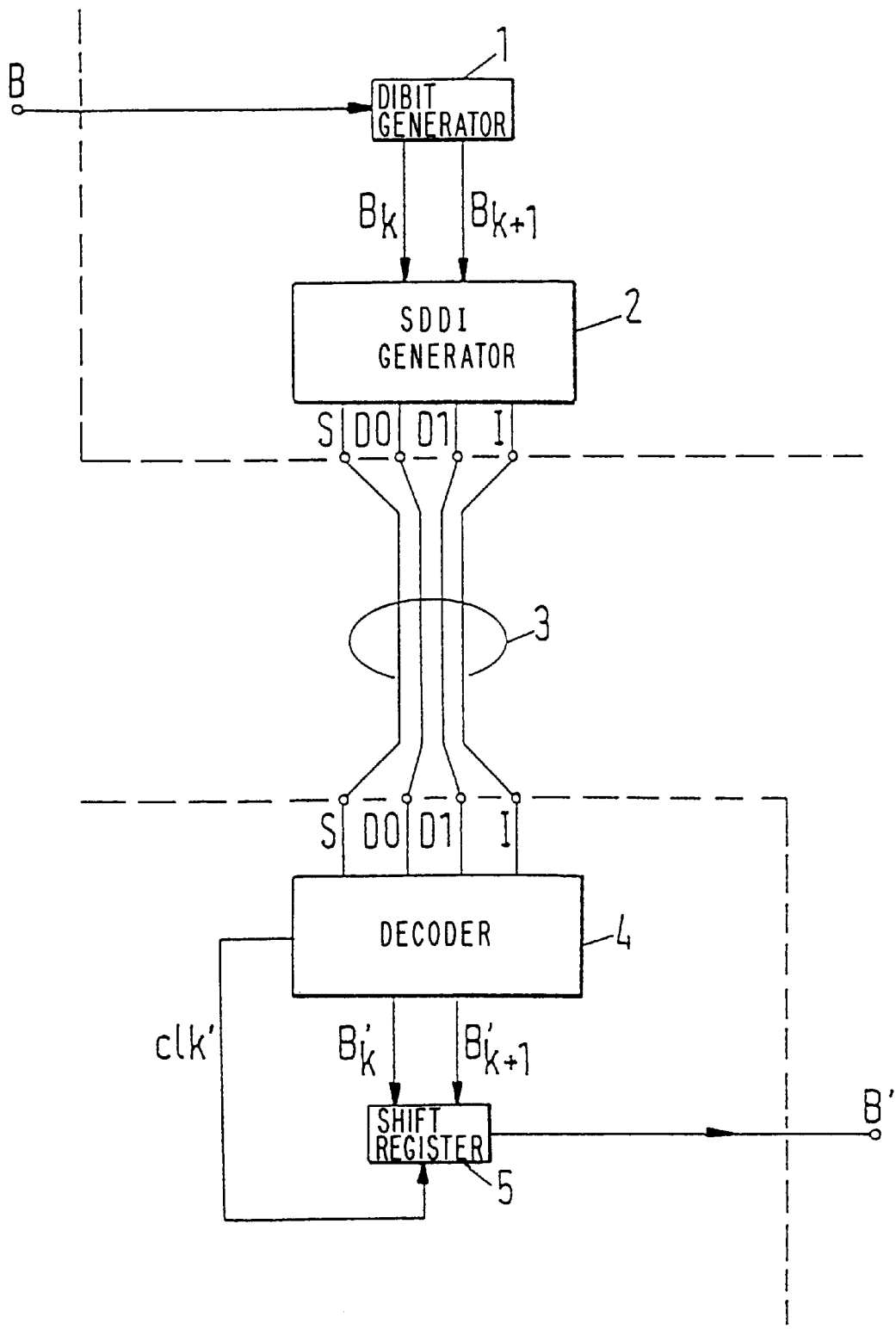
FIG. 1   a block diagram to explain the circuit arrangement according to the invention.

FIG. 1 shows a block diagram to explain the data transmission process. On the transmitter side, the interface comprises a Dibit generator 1 and an SDDI generator 2. The connection with the receiver is accomplished via four (wire) lines 3. On the receiver side, a decoder 4 and a shift register 5 are provided.

The transmitter-side interface accepts a binary signal B with a data rate of, for example, 800 Mbit/s. In Dibit generator 1, two data bits Bk, Bk+1 are combined in each case and are transmitted at half the data rate (for example, 400 Mbit/s), in parallel, to SDDI generator 2. The latter, in a manner explained further below, generates the four signals S, D0, D1 and I that are transmitted on four lines 3 to the transmitter or its interface.

From the four signals, decoder 4 extracts a clock signal clk' and two regenerated data bits Bk' and Bk+1'. These two parallel data bits Bk' and Bk+1' are converted into a serial data flow B' with a shift register 5 (which is controlled by clock signal clk').

Figure 2:
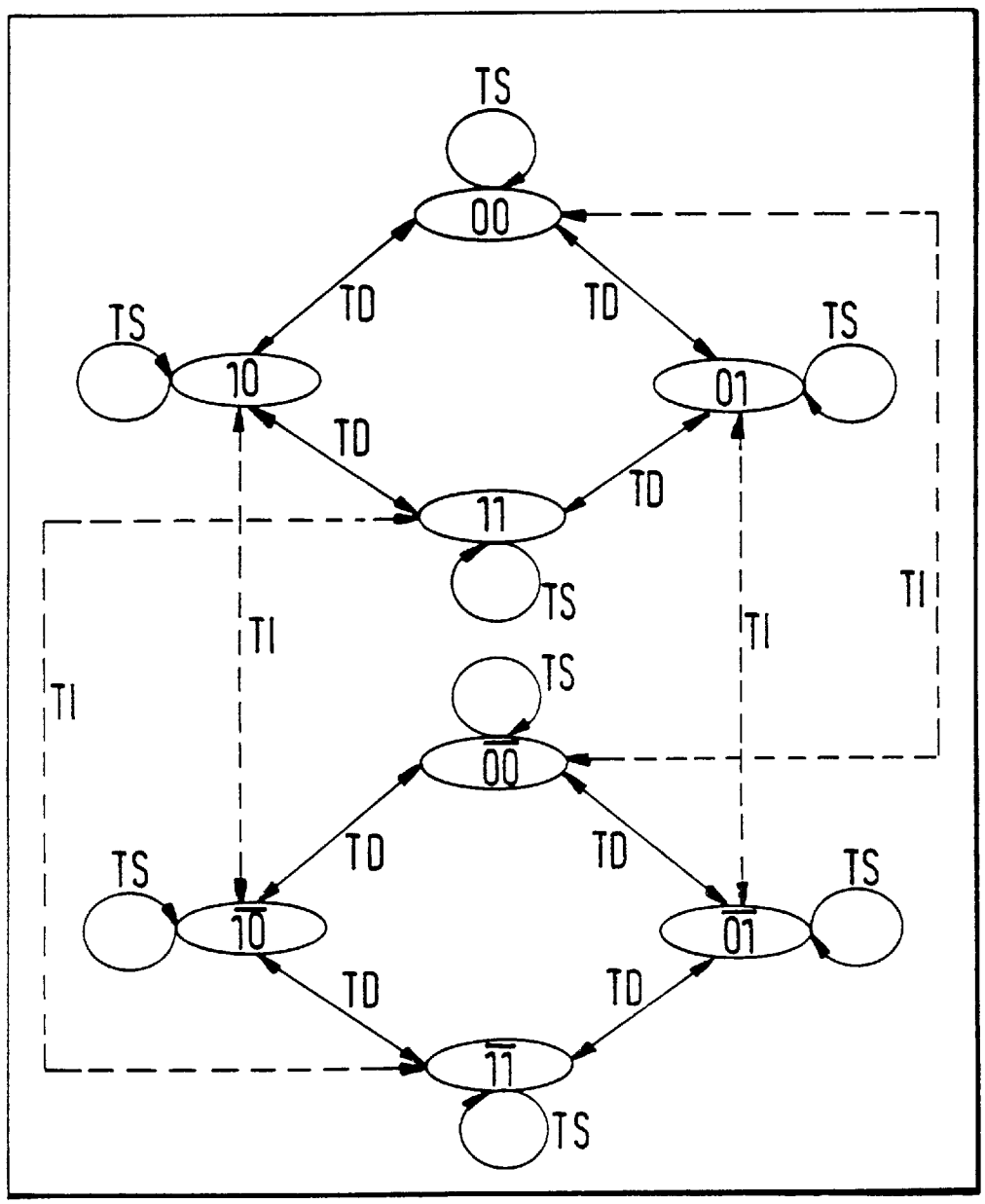
FIG. 2   a state change diagram to explain signal coding.

The state change diagram shown in FIG. 2 contains all possible state changes of the data bits. The connecting arrows show which of the four signals

| | |
|---|---|
| S | Strobe |
| D0 | Data bit |
| D1 | Data bit |
| I | Invert | must change its state in order to get to the next desired state. Arrows marked T signify a change of the invert signal I ("toggle invert"), those designated with TD indicate a change of one of the data bits D0 or D1 ("toggle data") and those labeled TS show a change of the strobe signal S ("toggle strobe").

To signal, for example, a change of the two data bits D0, D1 from "00" to "10," the data bit D0 is change (TD="toggle data"). All of the other three signals remain the same.

A change of the above-mentioned data bits from "00" to "11" is signaled (TI="toggle invert") by a change of the invert signal I (for example, from "0" to "1"), where, once again, all three other signals are kept constant. In the illustration according to FIG. 2, we have thus gotten into the graph (shown in the lower half). In the latter, there are lines above all data bits indicating inversion:

11=00
00=10
01=10
10=01

If the value of the two data bits does not change, then the state of the strobe signal S is changed (TS="toggle strobe"). As one can see in FIG. 2, at each junction point of the diagram, there is a "TS loop." One then always changes between the two diagaam halves when both data bits change ("TI-arrow"). A transition from one junction point to another within a diagram half signifies a change of one of the two data bits ("TI-arrow").

The graph shown in FIG. 2 is one of several possibilities for the pictorial illustration of signal coding. It describes all possible state changes in a summarizing fashion.

Figure 3:
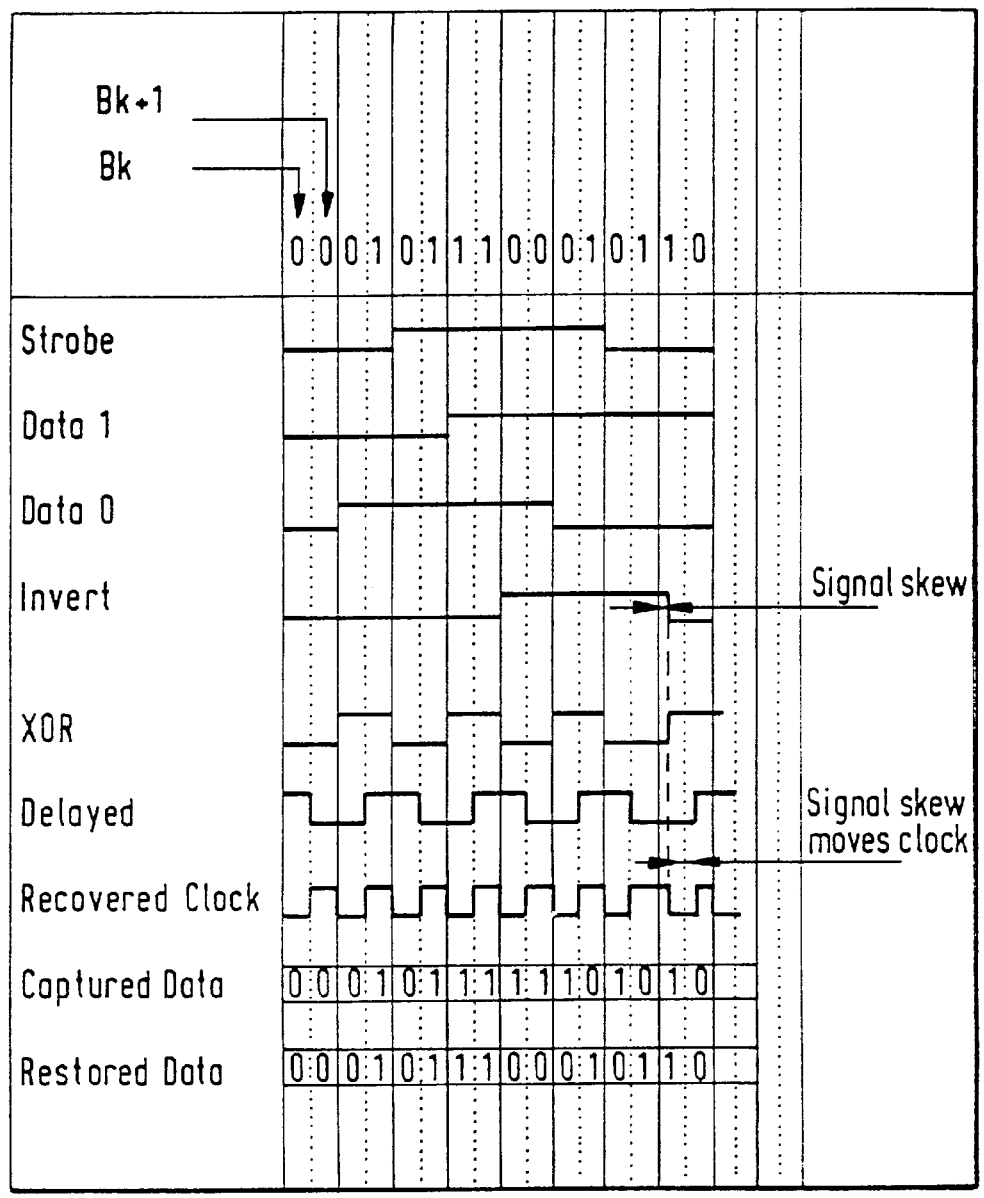
FIG. 3   a time diagram of the signals according to the invention.

The transmitter-side and receiver-side relevant signals are illustrated in FIG. 3. The binary data flow "0001011100010110"—that is shown by way of example—is, first of all, grouped in (not overlapping) bit pairs "00," ""01,""01,""11,""00,""01,""01,""10." The bit pairs appear with half data rate. Inside a "Dibit clock," with the D0 data bit and the second one is associated with the D1 data bit. The other two signals, for example, have the value ")." Upon transition to the next bit pair "01," the D0 data bit must be changed. In the next following transmission clock—in which the values of the D0, D1 data bits need not be changed—the strobe signal is then set high. The other state changes can be retraced or verified without any problem on the basis of FIG. 2.

Figure 4:
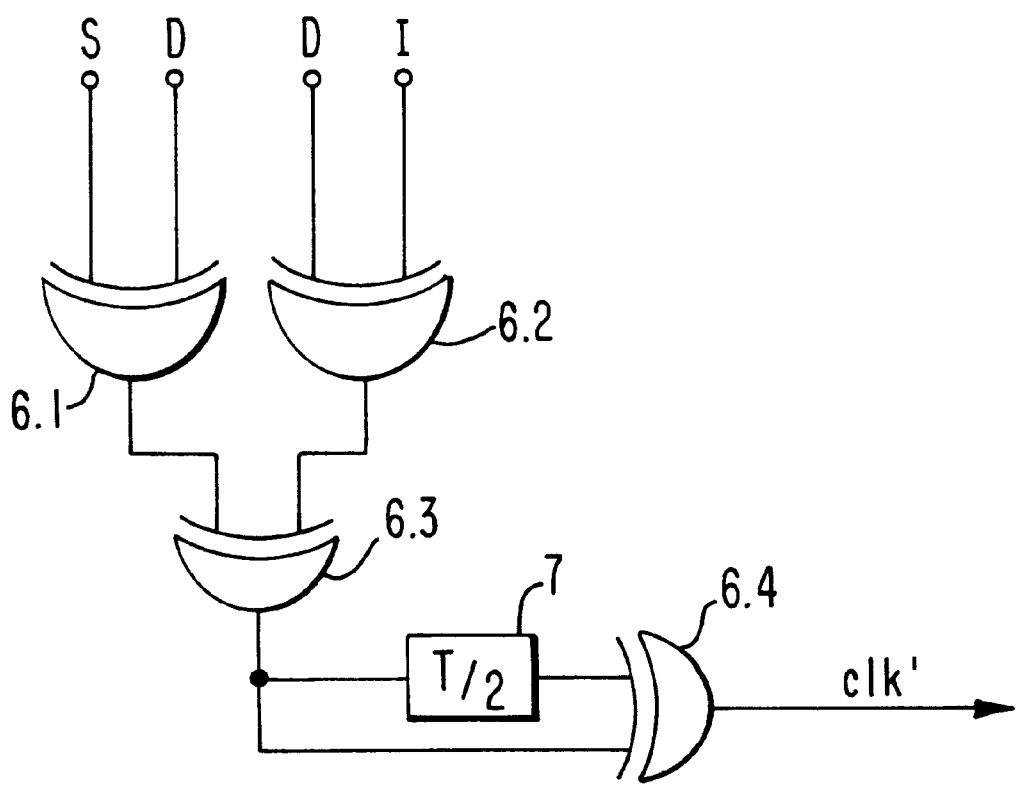
FIG. 4   an example of the circuit for the recovery of the clock signal.

To get a clock signal on the receiver side, one can tie the four incoming signals together by XOR elements 6.1 to 6.3, as is shown by way of example in FIG. 4. During signaling according to the invention, for each transmission clock in each case, precisely one signal changes its state; this is why—in a first step—this clock can be thus regenerated. Using a delay member 7, a delayed signal ("delayed") is derived from the transmission clock and is combined with the original one in an XOR element 6.4 to form the desired data clock clk'. One can do without delay element 7 and XOR element 6.4 if an edge detection circuit is provided which responds both to rising and falling edges or when additional circuit elements or techniques are employed.

FIG. 3 furthermore shows that in case of a shift of a signal edge (signal skew), the clock signal clk' is also shifted accordingly so that the receiver does not fall out of rhythm and so that no faulty data will be generated.

The four signals according to the invention naturally can also be transmitted with a differential signal coding procedure. Each of the four signals is then transmitted to two lines. In other words, one needs a total of eight line wires.

Summarizing, it should be noted that the signaling according to the invention facilitates a considerable increase in the transmission output as compared to purely serial data transmission and can thus get along with a comparatively minor circuitry engineering effort.

I claim:

1. A process for the transmission of a binary data flow comprising:
   a) combining data bits of data flow in pairs;
   b) transmitting the combined data bits in a coded manner in the form of four parallel signals; and
   c) connecting the four parallel signals into a resultant signal unaffected by parity, wherein
      d) states of the four parallel signals change in terms of a Grey code.

2. The process according to claim 1, wherein
   two of the four signals transmit the data bits; and
   the other two signals signal an inversion or an unchanged retention of the data bits.

3. The process according to claim 2, wherein
   a simultaneous change of the data bits is signaled by the change of an inversion of one of the four parallel signals with simultaneous retention of all of the other three signals.

4. The process according to claim 2, wherein
   the retention of the data bits is signaled by a change of one of the four parallel signals with simultaneous retention of all of the other three signals.

5. The process according to claim 1, wherein on a receiver side, a data clock signal is derived from state changes of the four parallel signals.

6. The process according to claim 5, further comprising:
   connecting the four parallel signals by XOR elements and doubling the resultant signal in terms of frequency.

7. A circuit arrangement comprising:
   means for combining data bits of data flow in pairs;
   means for transmitting the combined data bits in a coded manner in the form of four parallel signals; and
   means for connecting the four parallel signals into a resultant signal unaffected by parity, wherein:
      states of the four parallel signals change in terms of a Grey code.

8. The circuit arrangement according to claim 7, wherein on a transmitter side
   a) a state change of one of the data bits due to a change of a corresponding data signal is signaled with simultaneously unchanged retention of the other three signals,
   b) a state change of the data bits is signaled due to a change of an inversion of one of the four parallel signals with simultaneously unchanged retention of the other three signals (S, D0, or D1); and
   c) a retention of the data bits is signaled by a change of one of the four parallel signals with simultaneously unchanged retention of the other three signals.

9. The circuit arrangement according to claim 7, wherein on the receiver side, there is provided a clock recovery circuit in which the four parallel signals are interconnected with XOR elements to form one transmission clock signal that is delayed with a delay member by half a transmission clock and then tied in with the undelayed transmission clock signal in an XOR element to form a desired data clock.

10. The circuit arrangement according to claim 7, wherein:
   two of the four signals transmit the data bits; and
   the other two signals signal an inversion or an unchanged retention of the data bits.

11. The circuit arrangement according to claim 10, wherein:
   a simultaneous change of the data bits is signaled by the change of an inversion of one of the four parallel signals with simultaneous retention of all of the other three signals.

12. The circuit arrangement according to claim 10, wherein:
   the retention of the data bits is signaled by a change of one of the four parallel signals with simultaneous retention of all of the other three signals.

13. The circuit arrangement according to claim 7, wherein on a receiver side, a data clock signal is derived from state changes of the four parallel signals.

14. The circuit arrangement according to claim 13, wherein the four parallel signals are connected by XOR elements and the resultant signal is doubled in terms of frequency.

15. A circuit arrangement comprising:

a generator that combines data bits of data flow in pairs;

a transmitter that transmits the combined data bits in a coded manner in the form of four parallel signals; and a decoder that connects the four parallel signals into a resultant signal unaffected by parity, wherein
states of the four parallel signals change in terms of a Grey code.

16. The circuit arrangement of claim 15, the decoder comprising:

a clock recovery circuit having XOR elements that interconnects the four parallel signals to form a transmission clock signal.

17. The circuit arrangement of claim 16, further comprising:

a delay member that delays the transmission clock signal by half a transmission clock; and another XOR element that interconnects the delayed transmission clock signal and the transmission clock signal to form a desired data clock.

18. The circuit arrangement of claim 16 further comprising an edge detection circuit that forms a desired data clock based on the transmission clock signal.

19. A process for the transmission of a binary data flow comprising:

a) combining data bits of data flow in pairs; and b) transmitting the combined data bits in a coded manner in the form of only four parallel signals, wherein c) states of the four parallel signals change in terms of a Grey code.

* * * * *